United States Patent
Um et al.

(10) Patent No.: US 9,679,935 B2
(45) Date of Patent: Jun. 13, 2017

(54) IMAGE SENSORS

(71) Applicant: Samsung Electronics Co., Ltd., Suwon-si (KR)

(72) Inventors: Changyong Um, Seoul (KR); Byungjun Park, Yongin-si (KR); Jungchak Ahn, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/960,449

(22) Filed: Dec. 7, 2015

(65) Prior Publication Data
US 2016/0204142 A1 Jul. 14, 2016

(30) Foreign Application Priority Data

Jan. 14, 2015 (KR) .................. 10-2015-0006908

(51) Int. Cl.
*H01L 27/146* (2006.01)

(52) U.S. Cl.
CPC ...... *H01L 27/1463* (2013.01); *H01L 27/1464* (2013.01); *H01L 27/14643* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 4,495,025 A | 1/1985 | Haskell | |
| 5,895,253 A | 4/1999 | Akram | |
| 6,827,869 B2 | 12/2004 | Podlesnik et al. | |
| 7,151,022 B2 | 12/2006 | Kim | |
| 7,807,543 B2 | 10/2010 | Shin et al. | |
| 8,513,761 B2 | 8/2013 | Roy et al. | |
| 2002/0119666 A1* | 8/2002 | Kim | H01L 21/76232 438/704 |
| 2008/0001192 A1* | 1/2008 | Inoue | H01L 27/14603 257/291 |
| 2010/0055856 A1 | 3/2010 | Hong et al. | |
| 2011/0266645 A1* | 11/2011 | Chao | H01L 27/14603 257/432 |

(Continued)

FOREIGN PATENT DOCUMENTS

| | | |
|---|---|---|
| JP | H11-297810 A | 10/1999 |
| KR | 10-2003-0097343 A | 6/2002 |

(Continued)

*Primary Examiner* — Charles Garber
*Assistant Examiner* — Alia Sabur
(74) *Attorney, Agent, or Firm* — Muir Patent Law, PLLC

(57) ABSTRACT

An image sensor may include a device isolation structure defining a plurality of pixel regions in a substrate and a photoelectric conversion element formed in each of the pixel regions. The device isolation structure may include an insulating gapfill layer extending from an upper portion to a lower portion of the device isolation structure, a spacer provided at the upper portion of the device isolation structure and interposed between the insulating gapfill layer and the substrate, and a lower impurity region provided at the lower portion of the device isolation structure and interposed between the insulating gapfill layer and the substrate.

16 Claims, 22 Drawing Sheets

(56) References Cited

U.S. PATENT DOCUMENTS

2013/0113061 A1* 5/2013 Lai .................. H01L 27/1463
                                                  257/432
2015/0130016 A1* 5/2015 Kao ................. H01L 27/1463
                                                  257/510

FOREIGN PATENT DOCUMENTS

KR  10-2005-0058816 A  6/2005
KR     10-0972899 B1   7/2010

* cited by examiner

2000

IMAGE SENSORS

CROSS-REFERENCE TO RELATED APPLICATIONS

This U.S. non-provisional patent application claims priority under 35 U.S.C. §119 to Korean Patent Application No. 10-2015-0006908, filed on Jan. 14, 2015, in the Korean Intellectual Property Office, the entire contents of which are hereby incorporated by reference.

BACKGROUND

The present disclosure relates to image sensors and methods of fabricating the same, and in particular, to CMOS image sensors (CIS) and methods of fabricating the same.

An image sensor is a device that converts optical images into electrical signals. With increased development of the computer and communications industries, there is an increased demand for high performance image sensors in a variety of applications such as digital cameras, camcorders, personal communication systems, gaming machines, security cameras, micro-cameras for medical applications, and/or robots.

The image sensors may be generally classified into charge coupled device (CCD) and complementary metal-oxide semiconductor (CMOS) image sensors. The CMOS image sensors are operated using a simple operation method and are configured to have signal processing circuits integrated on a single chip, and thus, they make it possible to realize products including scaled CMOS image sensors. In addition, CMOS image sensors may operate with relatively low consumption power, and thus, they are applicable to portable electronic devices.

As the electronic industry develops, a size of the image sensor becomes smaller and smaller. Accordingly, much research is conducted to realize an image sensor with a high density.

SUMMARY

Example embodiments of the inventive concept provide highly-integrated image sensors.

Other example embodiments of the inventive concept provide methods of fabricating the image sensor.

According to some example embodiments of the inventive concept, an image sensor may include a substrate with a top surface and a bottom surface, a device isolation structure defining a plurality of pixel regions in the substrate, and a photoelectric conversion device formed in each of the pixel regions. The device isolation structure may include an insulating gapfill layer extending from an upper portion to a lower portion of the device isolation structure, a spacer provided at the upper portion of the device isolation structure and interposed between the insulating gapfill layer and the substrate, and a lower impurity region provided at the lower portion of the device isolation structure and interposed between the insulating gapfill layer and the substrate.

In example embodiments, the substrate may have a first conductivity type, the photoelectric conversion device may have a second conductivity type different from the first conductivity type, and the lower impurity region may have the first conductivity type.

In example embodiments, the insulating gapfill layer may be extended from the top surface of the substrate to the bottom surface of the substrate through the substrate.

In example embodiments, the image sensor may further include an upper impurity region between the spacer and the insulating gapfill layer. The upper impurity region may have the first conductivity type.

In example embodiments, the lower impurity region may have an impurity concentration higher than that of the upper impurity region.

In example embodiments, the image sensor may further include a thin thermal oxide layer between the spacer and the substrate.

In example embodiments, the device isolation structure may include a plurality of portions, each of which is shaped like a rectangular ring and encloses a corresponding of the pixel regions.

In example embodiments, a total height of the insulating gapfill layer of the device isolation structure may be greater than that of the photoelectric conversion device, and a total height of the spacer may be smaller than that of the photoelectric conversion device.

In example embodiments, the spacer of the device isolation structure may include at least one of middle temperature oxide (MTO), polyethylene oxide (PEOX), silicon nitride (SiN), or silicon oxynitride (SiON), and the insulating gapfill layer of the device isolation structure may include at least one of high density plasma (HDP) oxide, undoped silicate glass (USG), middle temperature oxide (MTO), plasma enhanced chemical vapor deposition (PECVD) oxide, or silicon nitride (SiN).

In example embodiments, a top surface of the spacer may be substantially coplanar with the top surface of the substrate and/or a top surface of the insulating gapfill layer.

In example embodiments, the image sensor may further include a readout circuit on the top surface of the substrate and electrically connected to the photoelectric conversion device.

In example embodiments, the image sensor may further include a color filter on the bottom surface of the substrate to face a corresponding one of the pixel regions, and a micro lens on the color filter.

In example embodiments, the insulating gapfill layer may be self-aligned by the spacer.

According to some example embodiments of the inventive concept, an image sensor may include a substrate with a top surface and a bottom surface, a deep trench isolation (DTI) structure defining a plurality of pixel regions in the substrate, a shallow trench isolation (STI) structure adjacent to the top surface of the substrate and on an upper side surface of the DTI structure to serve as a spacer, a lower impurity region between a lower portion of the DTI structure and the substrate, and a photoelectric conversion device formed in each of the pixel regions.

In example embodiments, the DTI structure may be self-aligned by the STI structure.

In example embodiments, the substrate may have a first conductivity type, the photoelectric conversion device may have a second conductivity type different from the first conductivity type, and the lower impurity region may have the first conductivity type.

In example embodiments, the image sensor may further include an upper impurity region between the DTI and STI structures. The upper impurity region may have the first conductivity type.

In example embodiments, the lower impurity region may have an impurity concentration higher than that of the upper impurity region.

In example embodiments, the DTI structure may be extended from the top surface of the substrate to the bottom surface of the substrate through the substrate.

In example embodiments, the top surface of the spacer may be substantially coplanar with the top surface of the substrate and/or the top surface of the insulating gapfill layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
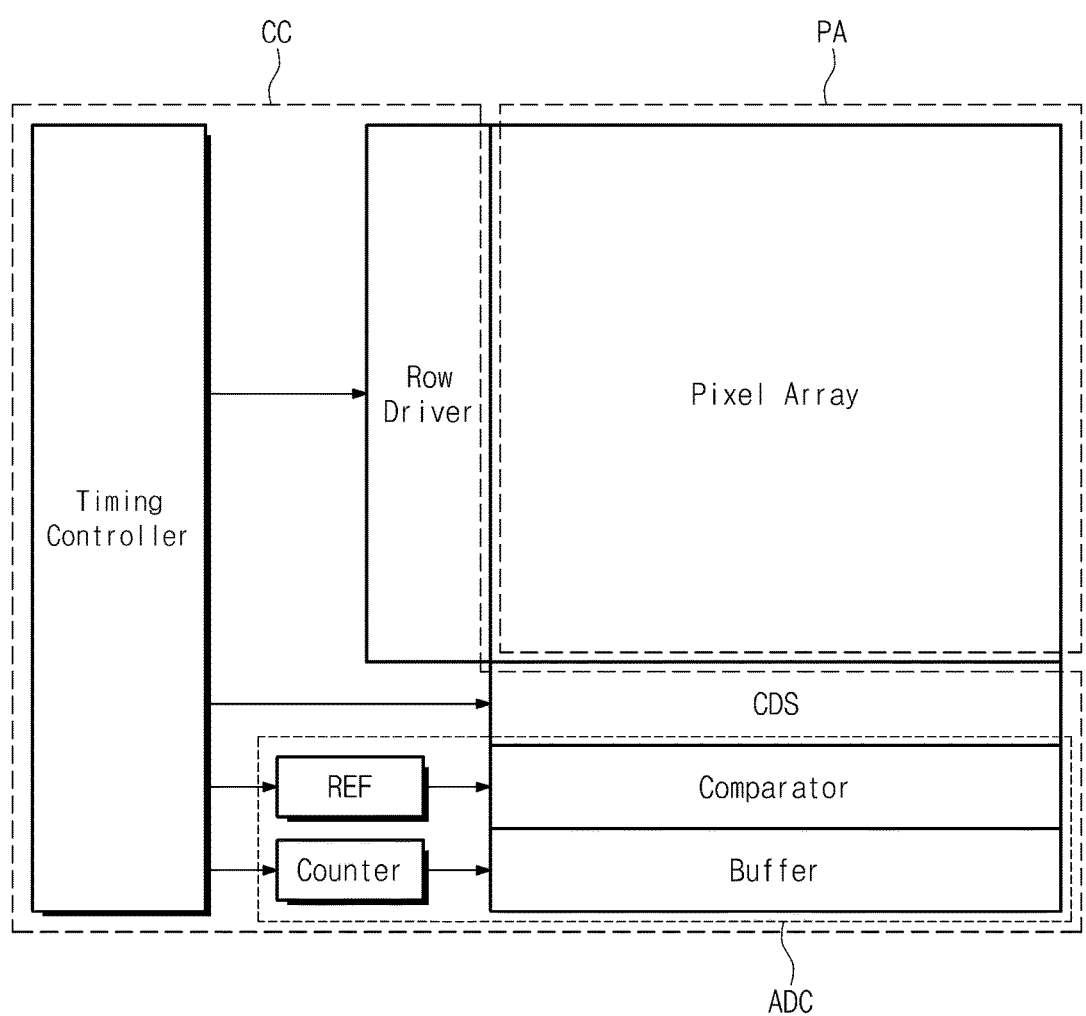
FIG. 1 is a block diagram of an image sensor according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. In addition, though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below in one section of the specification could be termed a second element, component, region, layer or section in another section of the specification without departing from the teachings of example embodiments. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of an image sensor according to example embodiments of the inventive concept. A CMOS-type image sensor will be described as an example of the image sensor of FIG. 1.

Referring to FIG. 1, the image sensor may include a pixel array PA and a signal processing unit CC.

The pixel array PA may be configured to convert incident light to electric signals. The pixel array PA may include a plurality of unit pixels (not shown) arranged in a matrix. The pixel array PA may be operated by various driving signals sent from the signal processing unit CC and may deliver the electrical signals to the signal processing unit CC.

The signal processing unit CC may be configured to produce image data from the electric signals. In some embodiments, the signal processing unit CC may be a circuit that includes a row driver, a correlated double sampler (CDS), an analog-to-digital converter (ADC), and a timing controller.

The row driver may be connected to each row of the pixel array PA and may generate driving signals for driving each row. For example, a plurality of unit pixels constituting each row of the pixel array PA may be collectively operated by the row driver.

The CDS may perform a correlated double sampling by obtaining a difference between a reference voltage, which represents a reset state of the unit pixel, and an output voltage, which represents a signal component corresponding to incident light, using a capacitor or a switch, and then, output an analog sampling signal corresponding to an effective signal component. The CDS may include a plurality of CDS circuits connected to each of column lines of the pixel array PA and may output the analog sampling signal corresponding to the effective signal component to each column.

The ADC may convert the analog image signal corresponding to the effective signal component into a digital image signal. The ADC may include, for example, a reference signal generator REF, a comparator, a counter, and a buffer. The ADC may generate the reference signal (e.g., a ramp signal with a specific slope) and may provide the ramp signal as a reference signal of the comparator. The comparator may compare an analog sampling signal, which is output to each column from the CDS, with the ramp signal generated by the reference signal generator REF, and output comparison signals, whose transition times are dependent on the effective signal component. The counter may perform a counting operation for generating a counting signal and may provide the counting signal to the buffer. The buffer may include a plurality of latch circuits coupled to the column lines, respectively. Also, the buffer may latch the counting signal to be output from the counter to each column, in response to the transition of each comparison signal, and then, may output the latched counting signal as the image data.

The timing controller may control operation timings of the row driver, the CDS, and the ADC. For example, the timing controller may provide timing and control signals to the row driver, the CDS, and the ADC.

Although an analog double sampling operation of the image sensor is exemplarily described with reference to FIG. 1, the image sensor may be configured to perform a digital double sampling (DDS) operation. For example, in the DDS operation according to some embodiments, if a pixel is reset, two analog signals for reset and signal components are respectively converted to digital signals and then a difference between two digital signals is output as an effective signal component.

FIGS. 2A through 2D are circuit diagrams exemplarily illustrating unit pixels in a pixel array according to example embodiments of the inventive concept.

Figure 2A:
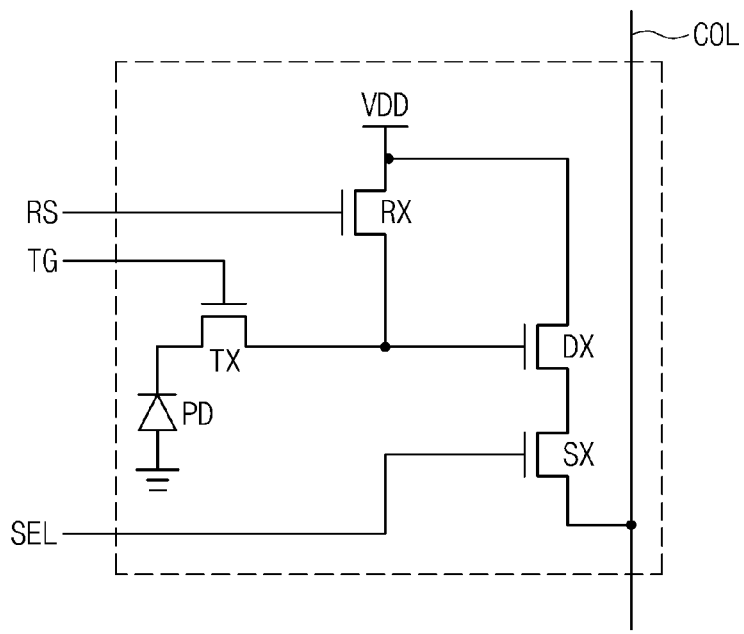
FIGS. 2A through 2D are circuit diagrams illustrating some examples of a unit pixel in a pixel array according to example embodiments of the inventive concept.

Referring to FIG. 2A, the unit pixel may include a photo sensitive element (e.g., such as a photodiode PD) and a readout circuit including a transfer transistor TX, a reset transistor RX, a drive transistor DX, and a selection transistor SX.

The photodiode PD receives the incident light and generates a photo charge based on the incident light. In some example embodiments, the unit pixel 200a may include a photo transistor, a photo gate, a pinned photo diode, etc., instead of or in addition to the photodiode PD.

The photo-charge generated in the photodiode PD may be transferred to a floating diffusion node FD through the transfer transistor TX, which is turned on in response to a transfer control signal TG. For example, if the transfer control signal TG has a first level (e.g., a high level), the transfer transistor TX may be turned-on, and thus, photo charges generated in the photodiode PD may be transferred to the floating diffusion node FD.

The drive transistor DX may serve as a source follower amplifier that amplifies a signal corresponding to an amount of photo-charges contained in the floating diffusion node FD. The selection transistor SX may transfer the amplified signal to a column line COL in response to a selection signal SEL. The floating diffusion node FD may be reset by the reset transistor RX. For example, the reset transistor RX may discharge the floating diffusion node FD, every period suitable for the CDS operation, in response to a reset signal RS.

FIG. 2A illustrates the unit pixel of the four-transistor configuration including the four MOS transistors TX, RX, DX and SX. The configuration of the unit pixel may be variously changed as illustrated in FIGS. 2B, 2C, and 2D.

Figure 2B:
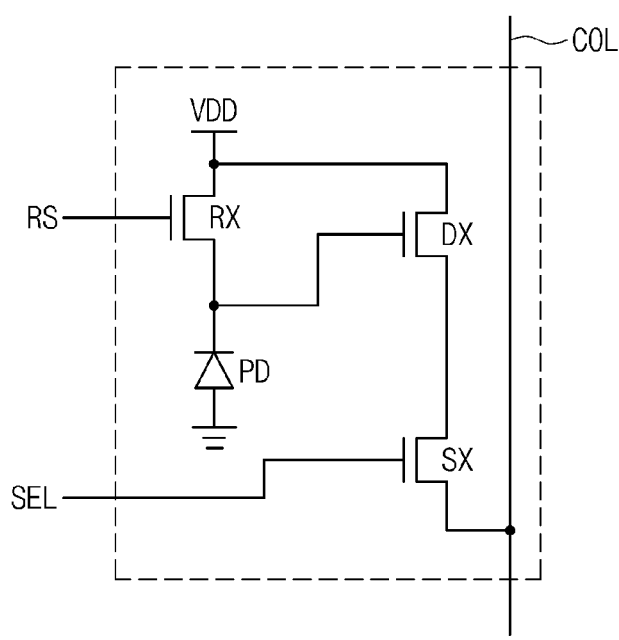

Referring to FIG. 2B, the unit pixel may have a three-transistor configuration including a photo sensitive element (e.g., a photodiode PD) and a readout circuit including a reset transistor RX, a drive transistor DX, and a selection transistor SX. Compared with the unit pixel of FIG. 2A, the transfer transistor TX is omitted in the unit pixel of FIG. 2B.

Figure 2C:
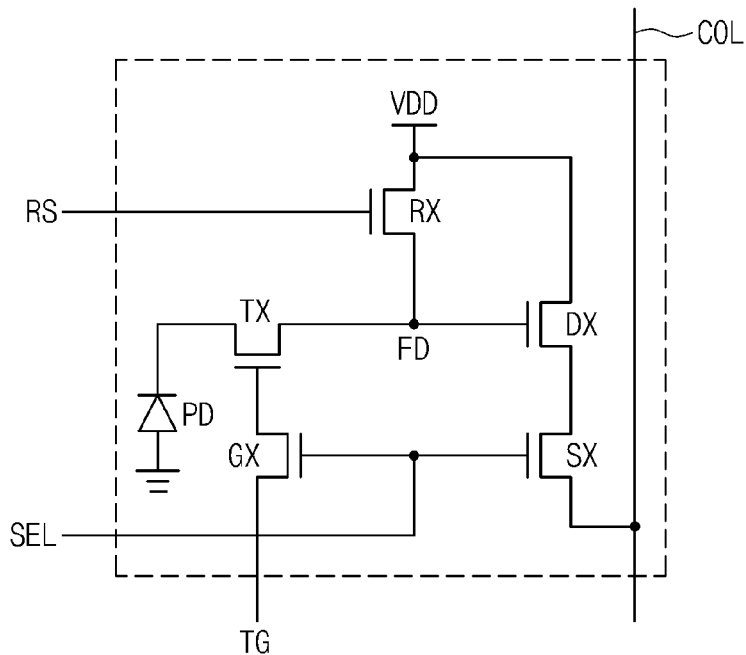

Referring to FIG. 2C, the unit pixel may have a five-transistor configuration including a photo sensitive element (e.g., a photodiode PD) and a readout circuit including, for example, a transfer transistor TX, a gate transistor GX, a reset transistor RX, a drive transistor DX, and a selection transistor SX. The gate transistor GX may selectively apply the transfer control signal TG to the transfer transistor TX in response to the selection signal SEL.

Figure 2D:
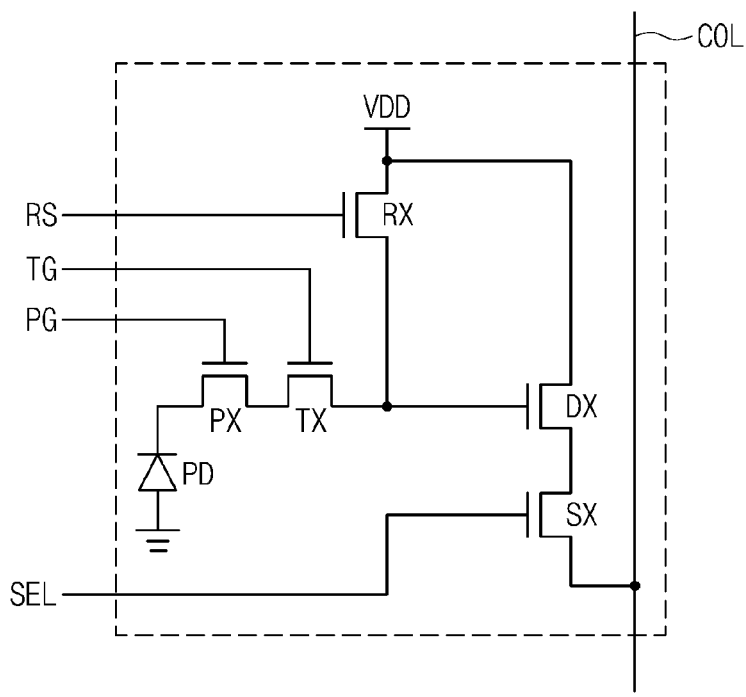

Referring to FIG. 2D, the unit pixel may have a five-transistor configuration including a photo sensitive element (e.g., a photodiode PD) and a readout circuit including a photo transistor PX, a transfer transistor TX, a reset transistor RX, a drive transistor DX and a selection transistor SX. In certain cases, the unit pixel may have a six-transistor configuration further including a gate transistor GX or a bias transistor. The photo transistor PX may be turned on or off in response to a photo gate signal PG. The unit pixel may be enabled when the photo transistor PX is turned on and be disabled when the photo transistor PX is turned off.

In example embodiments, the unit pixel, illustrated in FIGS. 2A through 2D, may be operated independently of the other unit pixels. However, in other embodiments, at least a portion of the unit pixel may be shared by the other unit pixels. For example, each unit pixel of FIG. 2A may include the respective photodiode PD and the respective transfer transistor TX, and the other elements such as the floating diffusion node FD, the reset transistor RX and the selection transistor SX may be shared by two or more unit pixels. The unit pixels may be independently operated by a timing control.

Figure 3A:
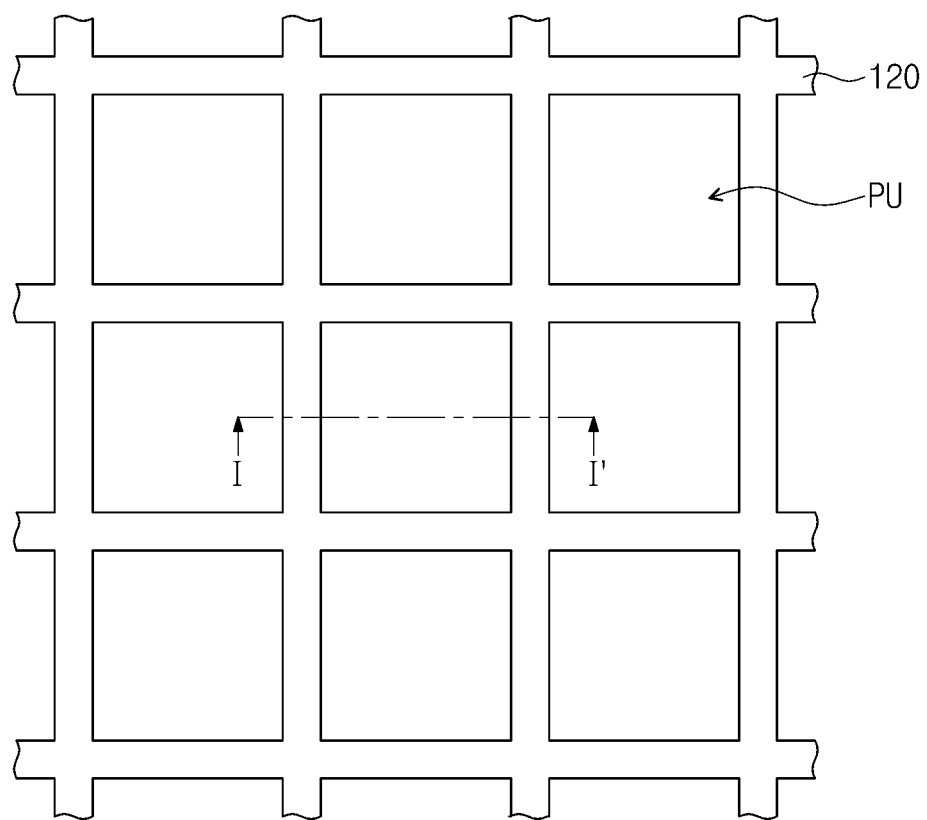
FIG. 3A is a plan view illustrating an image sensor according to example embodiments of the inventive concept.
Figure 3B:
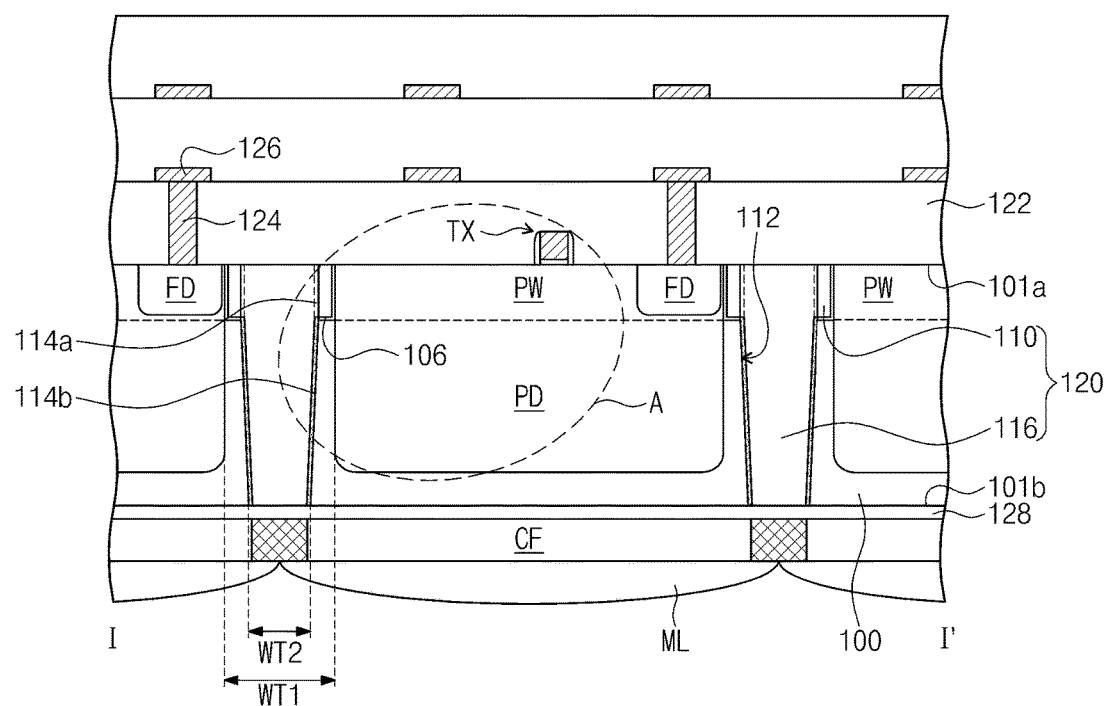
FIG. 3B is an exemplary sectional view of the image sensor, taken along line I-I' of FIG. 3A.
Figure 3C:
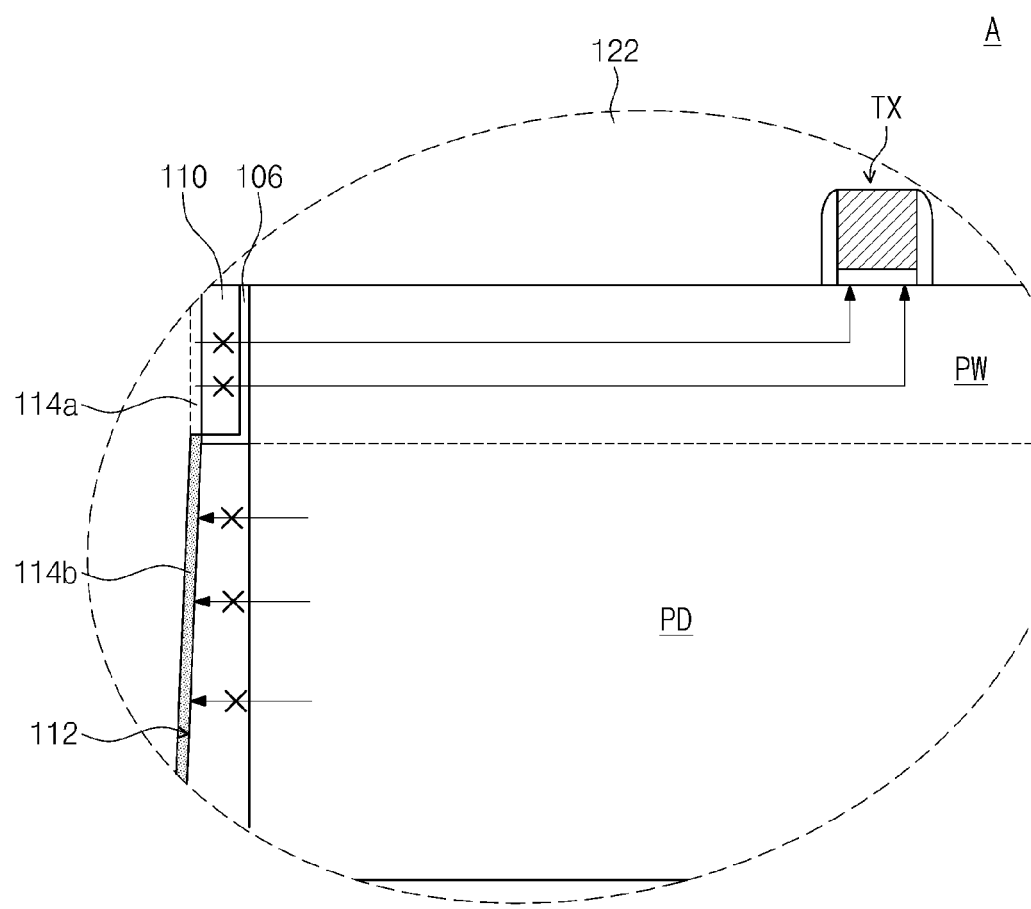
FIG. 3C is an exemplary enlarged view of a portion of FIG. 3B.

FIG. 3A is a plan view illustrating an image sensor according to some example embodiments of the inventive concept, and FIG. 3B is a sectional view of the image sensor, taken along the line I-I' of FIG. 3A. FIG. 3C is an enlarged view of a portion A of FIG. 3B.

Referring to FIGS. 3A, 3B, and 3C, an image sensor may include a substrate 100, a photoelectric conversion element PD, a device isolation structure 120, a floating diffusion region FD, and a readout circuit. The readout circuit may include a transfer gate TX. Although not shown, the readout circuit may further include a reset gate, a drive gate, and a selection gate. On behalf of the transfer gate illustrated in FIG. 3B, a reset gate, a drive gate, a selection gate, a gate of a gate transistor and/or a pixel gate may be configured.

The substrate 100 may have a top surface 101a and a bottom surface 101b. The substrate 100 may include a plurality of unit pixels PU. In example embodiments, the unit pixels PU may constitute a backside illuminated image sensor (BIS) configured to generate image data from incident light, which is incident through the bottom surface 101b of the substrate 100. In one embodiment, the substrate 100 may include a semiconductor layer, which may be formed by an epitaxial process, and may be doped with p-type impurities.

In the BIS with the unit pixels PU, a plurality of gate structures may be formed on the top surface 101a of the substrate 100 to transfer and amplify an electric signal, which is dependent on an amount of photocharges generated by the incident light. A color filter CF and a micro lens ML may be formed on the bottom surface 101b of the substrate 100 to provide the incident light into the photoelectric conversion element PD.

The photoelectric conversion element PD may be formed in the substrate 100 and may be configured to generate photocharges from the incident light. For example, the incident light may generate electron-hole pairs in the photoelectric conversion element PD, and the generated electrons or holes may be stored or collected in the photoelectric conversion element PD. The photoelectric conversion element PD may be doped to have a conductivity type (e.g., n-type) different from that of the substrate 100.

Although a photodiode is illustrated as an example of the photoelectric conversion element PD in FIGS. 3B and 3C, a photodiode, a photo transistor, a photo gate, a pinned photodiode, or any combination thereof may be used as the photoelectric conversion element PD.

A doped well region PW may be provided in the substrate 100 and on the photoelectric conversion element PD, and the doped well region PW may have a conductivity type different from that of the photoelectric conversion element PD. In one embodiment, the photoelectric conversion element PD may be a doped region of n-type, and the well region PW may be a doped region of p-type.

The floating diffusion region FD may be provided in the well region PW. The floating diffusion region FD may be doped to have a conductivity type different from that of the well region PW. For example, the floating diffusion region FD may be a doped region of n-type.

The transfer gate TX may be formed on the top surface 101a of the substrate 100 to transfer the photocharges generated in the photoelectric conversion element PD to the floating diffusion region FD. The transfer gate TX may operate in response to a transfer signal. For example, in the case where an activated transfer signal is applied to the transfer gate TX, the photocharges may be transferred to the floating diffusion region FD.

The photocharges, which are transferred through the transfer gate and are contained in the floating diffusion region FD, may be used to generate image data in the image sensor.

The reset gate (not shown) may be formed on the top surface 101a of the substrate 100 and may operate in response to a reset signal. A reset drain region (not shown) may be formed in the substrate 100 to receive a voltage for resetting the floating diffusion region FD. In the case where an activated reset signal is received, charges stored in the floating diffusion region FD may be discharged using the voltage, and thus, the floating diffusion region FD may be reset.

The device isolation structure 120 may be formed to enclose each of the unit pixels PU, and thus, the unit pixels PU may be spatially separated from each other by the device isolation structure 120. In one embodiment, the device isolation structure 120 may be provided to divide the unit pixels PU in a matrix structure. In certain cases, the device isolation structure 120 may be a rectangular ring shape so as to enclose each of the unit pixels PU.

In example embodiments, the device isolation structure 120 may include an upper portion with a first width WT1 and a lower portion with a second width WT2 that is smaller than the first width WT1. The device isolation structure 120 may include an insulating gapfill layer 116 and a spacer 110, which is interposed between the insulating gapfill layer 116 and the substrate 100 at an upper level of the device isolation structure 120. Due to the presence of the spacer 110, the upper portion of the device isolation structure 120 may have a width greater than the lower portion thereof.

According to some example embodiments of the inventive concept, the insulating gapfill layer 116 may be formed to serve as a deep trench isolation (DTI), preventing light incident into one of the unit pixels PU from being undesirably incident into other unit pixel PU adjacent thereto. In one embodiment, the insulating gapfill layer 116 may be formed to have a total height greater than that of the photoelectric conversion element PD. The spacer 110 may serve as a shallow trench isolation (STI) electrically isolating the unit pixels PU from each other. Here, the insulating gapfill layer 116 may also serve as the STI structure. The spacer 110 may be formed have a total height smaller than that of the photoelectric conversion element PD. A top surface of the spacer 110 may be coplanar with the top surface 101a of the substrate 100.

The spacer 110 may be formed of or include middle thermal oxide (MTO), polyethylene oxide (PEOX), SiN, SiON, or combinations thereof. The insulating gapfill layer 116 may include a material having a good gap-filling property. For example, the insulating gapfill layer 116 may be formed of or include high density plasma (HDP) oxide, plasma enhanced chemical vapor deposition (PECVD) oxide, undoped silicate glass (USG), middle temperature oxide (MTO) and/or nitrides. In one embodiment, a thin thermal oxide layer 106 may be provided between the spacer 110 and the substrate 100, at the upper portion of the device isolation structure 120. The thin thermal oxide layer 106 may be vertically extended to have a portion interposed between the insulating gapfill layer 116 and the substrate 100, at the lower portion of the device isolation structure 120.

The formation of the device isolation structure 120 may include etching the substrate 100 to form a trench 112 and filling the trench 112 with an insulating material. The trench 112 may be formed to have a downward decreasing width, and thus, the device isolation structure 120 may also have a downward decreasing width.

In example embodiments, a lower impurity region 114b may be formed in the substrate 100 adjacent to the lower portion of the device isolation structure 120. The lower impurity region 114b may be doped to have the same conductivity type as that of the substrate 100 and have a higher concentration than that of the substrate 100. For example, in the case where the substrate 100 is of a p-type, and the lower impurity region 114b may also be of the p-type.

In example embodiments, an upper impurity region 114a may be formed between the spacer 110 and the insulating gapfill layer 116. The upper impurity region 114a may be a doped region having the same conductivity as and substantially the same concentration as that of the substrate 100. For example, the upper impurity region 114a may contain the same impurity as those contained in the substrate 100. In one embodiment, in the case where the substrate 100 is formed to contain p-type impurities, the upper impurity region 114a may be doped with p-type impurities. Here, a doping concentration of the upper impurity region 114a may be lower than that of the lower impurity region 114b.

As described above, in the case where the lower impurity region 114b has a higher doping concentration than that of the substrate 100, it is possible to suppress or prevent impurities from being moved from the photodiode to the device isolation structure 120. Further, in the case where the upper impurity region 114a has substantially the same doping concentration as that of the substrate 100, it is possible to suppress impurities from being diffused into the gate structure. In addition, the spacer 110 positioned adjacent to the upper impurity region 114a may prevent impurities in the upper impurity region 114a from being moved.

The color filter CF may be provided on the bottom surface 101b of the substrate 100 to face the photoelectric conversion element PD. A plurality of color filters CF may be provided in a matrix shape to constitute a color filter array. In example embodiments, the color filter array may be configured to have a Bayer pattern including a red filter, a green filter, and a blue filter. For example, the color filter CF may be one of the red, green, and blue filters. In example embodiments, the color filter array may include a yellow filter, a magenta filter, and a cyan filter. In this case, the color filter CF may be one of the yellow, magenta, and cyan filters. Further, the color filter array may be configured to additionally include a white filter.

The micro lens ML may be formed on the color filter CF corresponding to the photoelectric conversion element PD. The micro lens ML may be configured to adjust a propagation path of the incident light. For example, the micro lens ML may focus light incident thereto to the photoelectric conversion element PD. In example embodiments, a plurality of micro lenses ML may be arranged in a matrix shape to constitute a micro lens array.

An anti-reflection layer 128 may be provided between the bottom surface 101b of the substrate 100 and the color filter CF. The anti-reflection layer 128 may prevent the incident light from being reflected at the bottom surface 101b of the substrate 100. In some example embodiments, the anti-reflection layer 128 may be formed by alternatingly stacking at least two different films, whose refractive indices are different from each other. In this case, by increasing the number of the alternatingly stacked films, it is possible to improve transmittance of the anti-reflection layer 128.

An interlayered insulating layer 122 may be formed on the top surface 101a of the substrate 100 to cover the gate structures. The first interlayered insulating layer 122 may have a multi-layered structure. The interlayered insulating layer 122 may include, for example, an oxide layer (e.g., of silicon oxide).

Wires 126 may be provided on the interlayered insulating layer 122 and may be electrically connected to the gate structures. The wires 126 may be formed of or include at least one of metals (e.g., copper (Cu) or tungsten (W)). The wires 126 may be electrically connected to the gate structures via contact plugs 124.

Figure 4A:
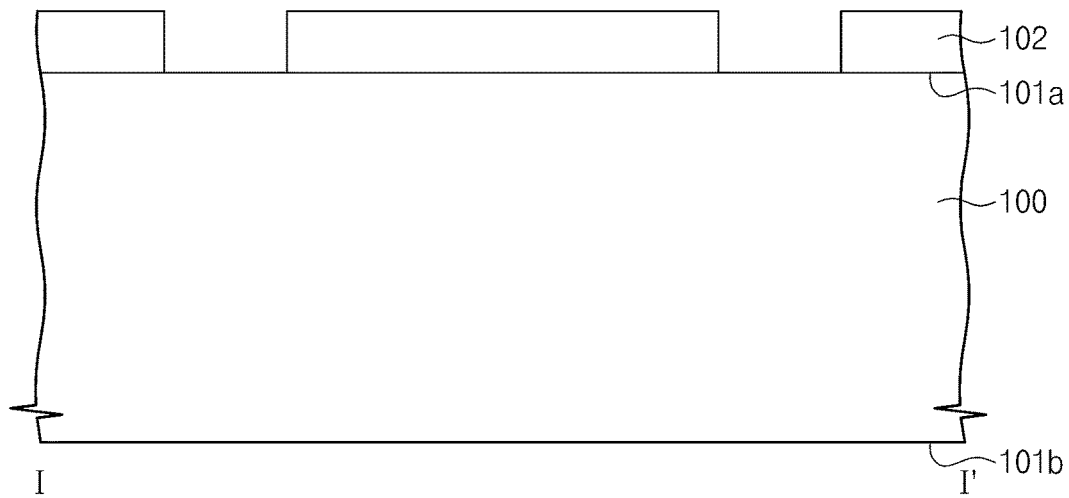
FIGS. 4A through 4N are sectional views illustrating a method of fabricating an image sensor according to example embodiments of the inventive concept.
Figure 4B:
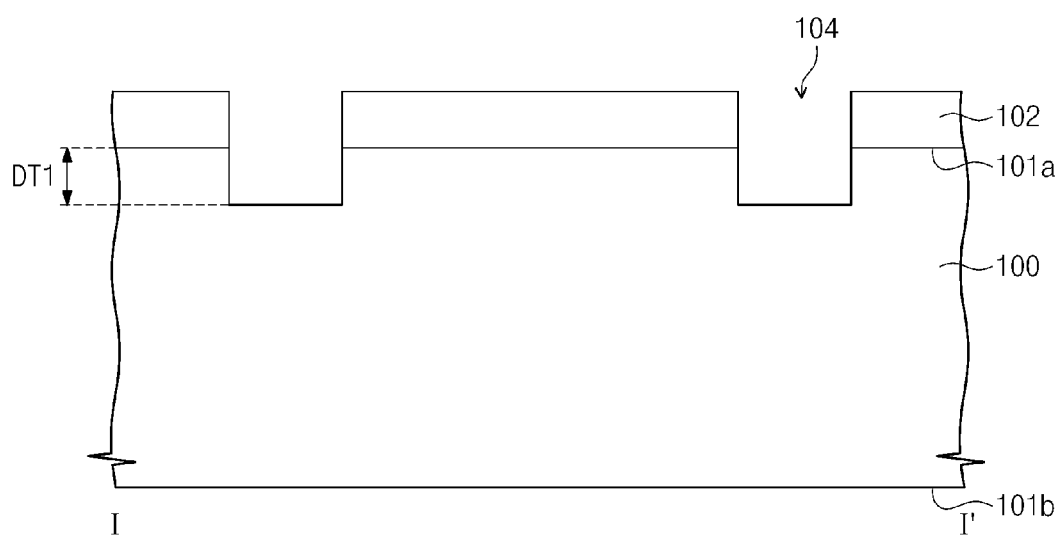
Figure 4C:
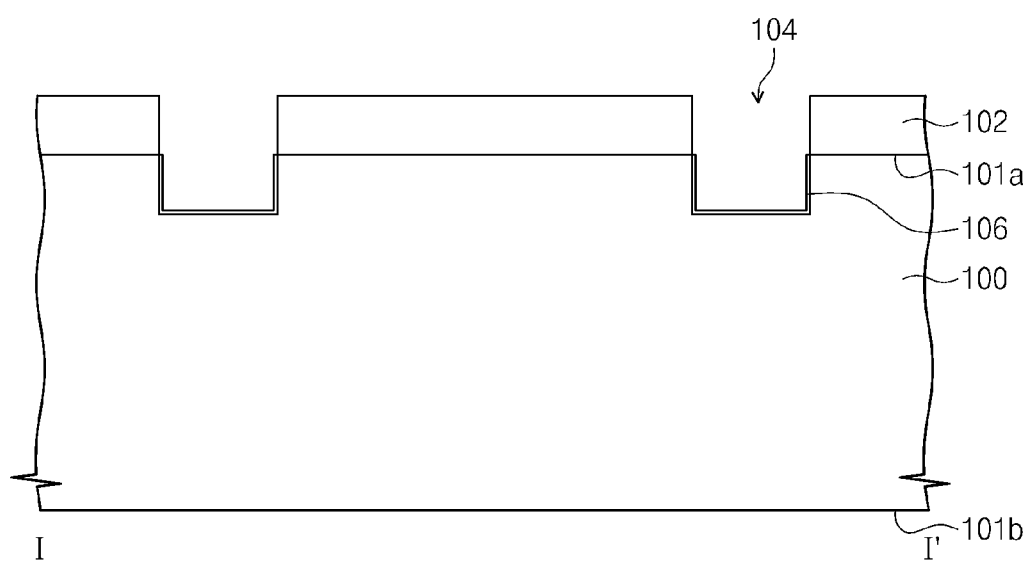
Figure 4D:
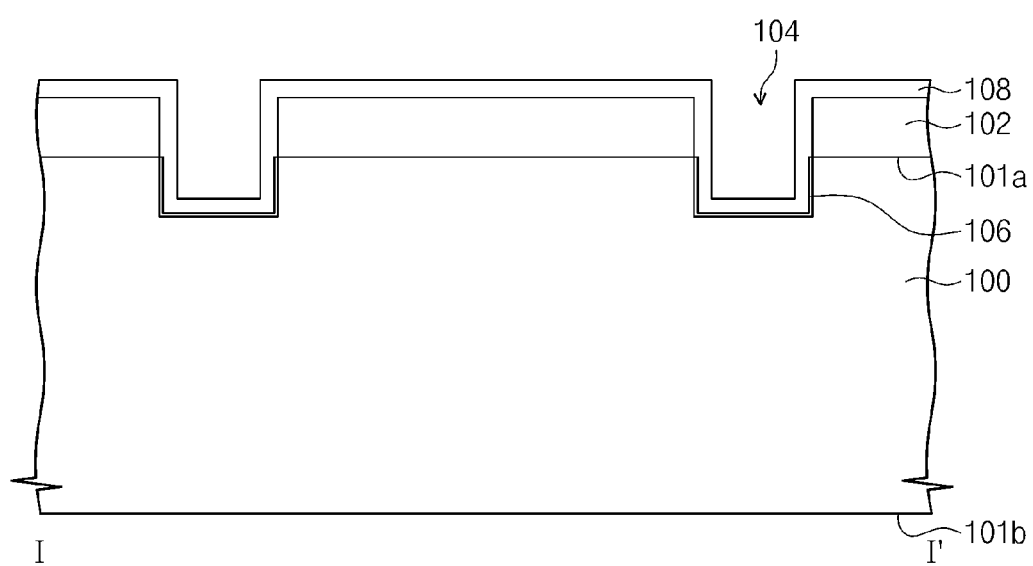
Figure 4E:
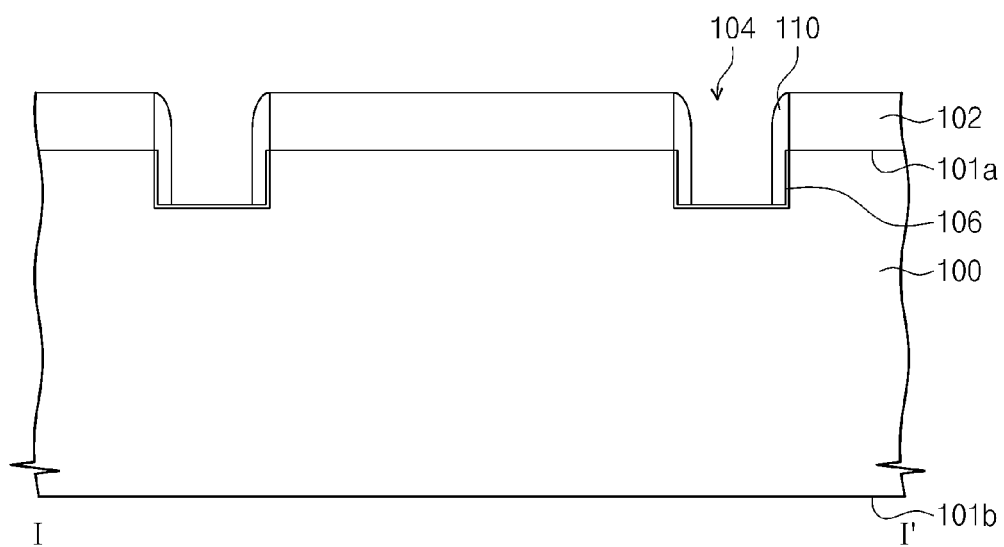
Figure 4F:
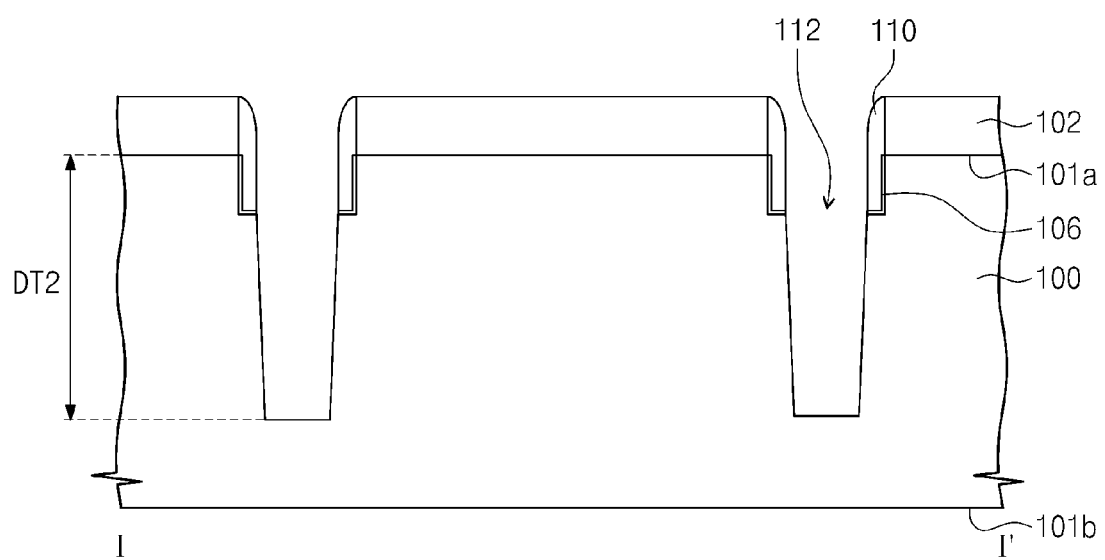
Figure 4G:
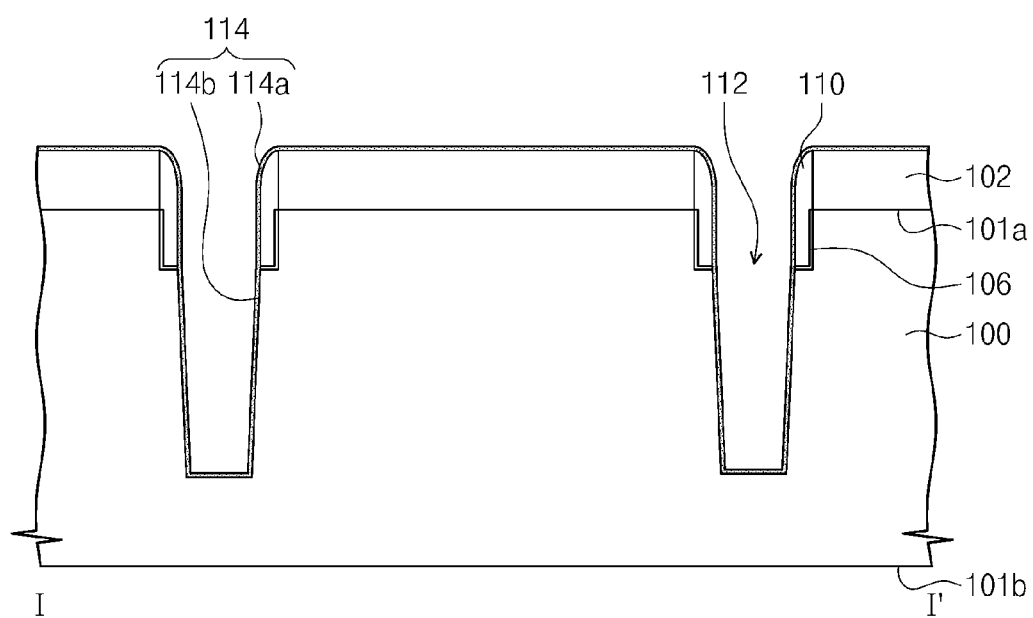
Figure 4H:
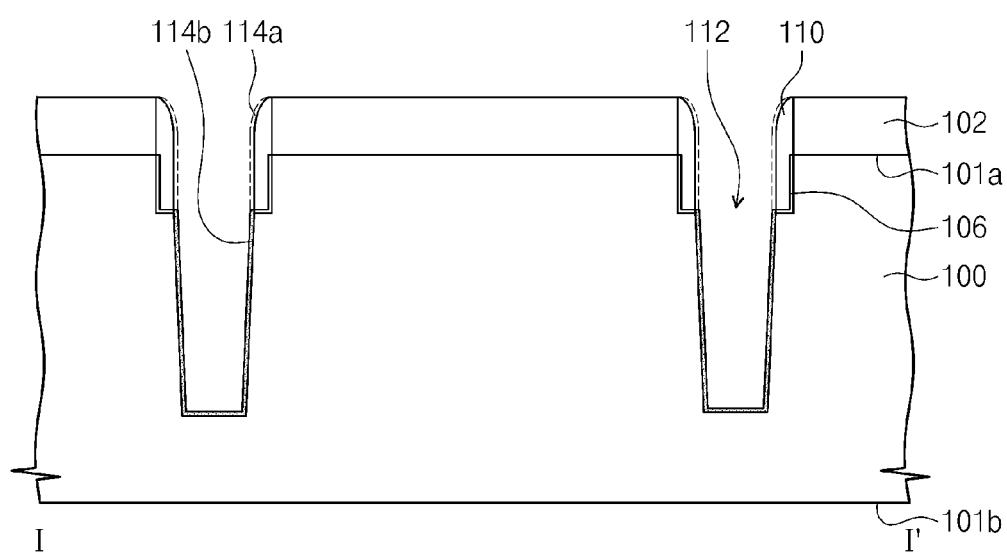
Figure 4I:
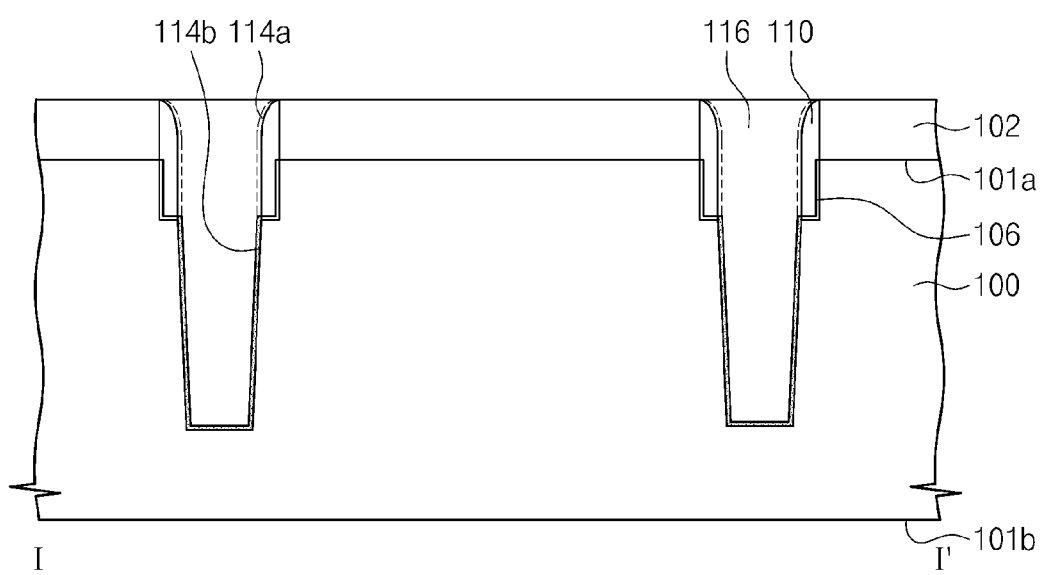
Figure 4J:
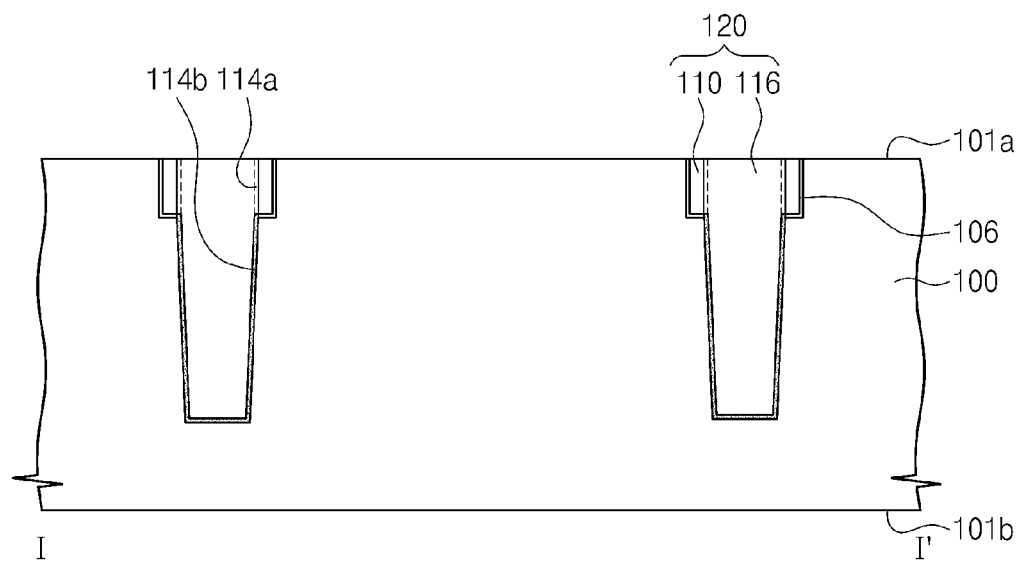
Figure 4K:
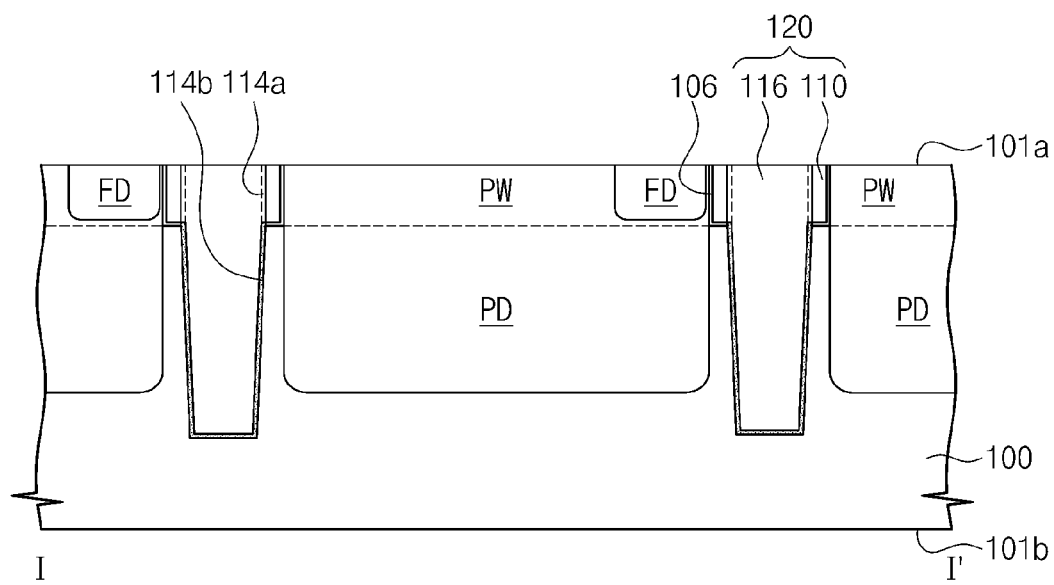
Figure 4L:
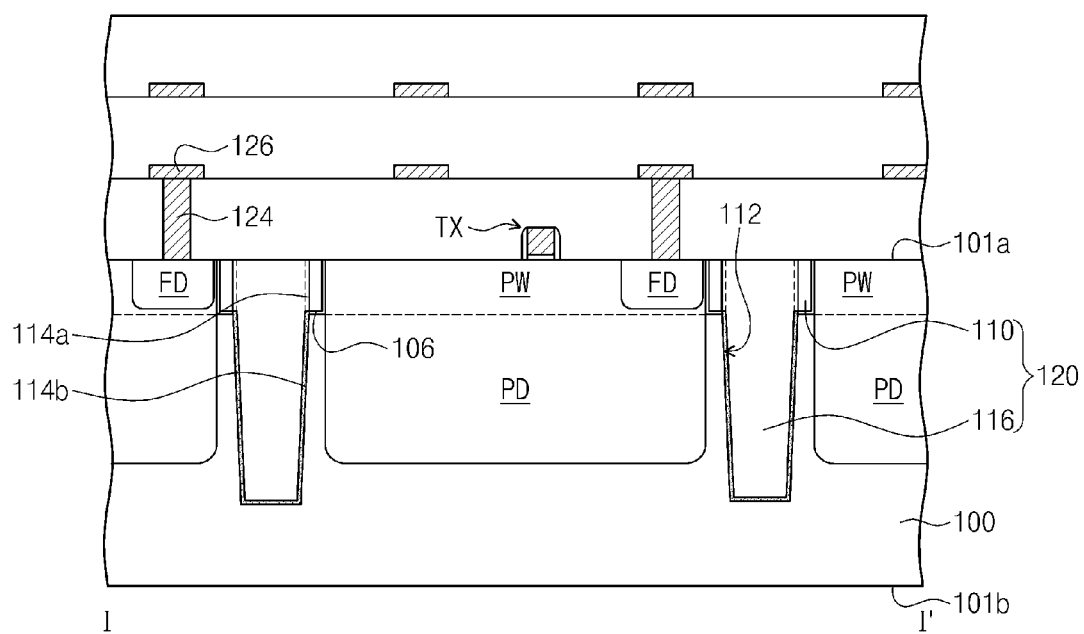
Figure 4M:
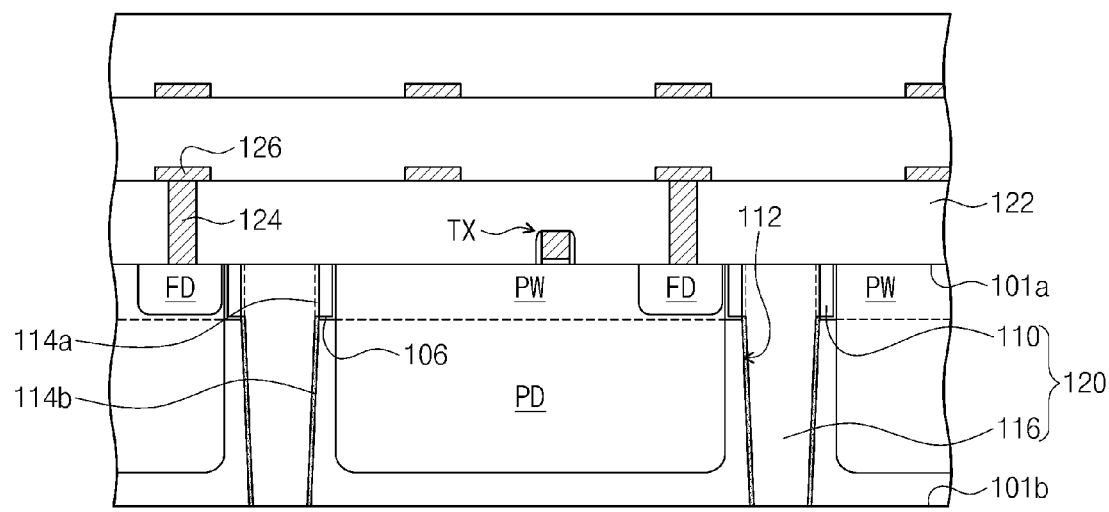
Figure 4N:
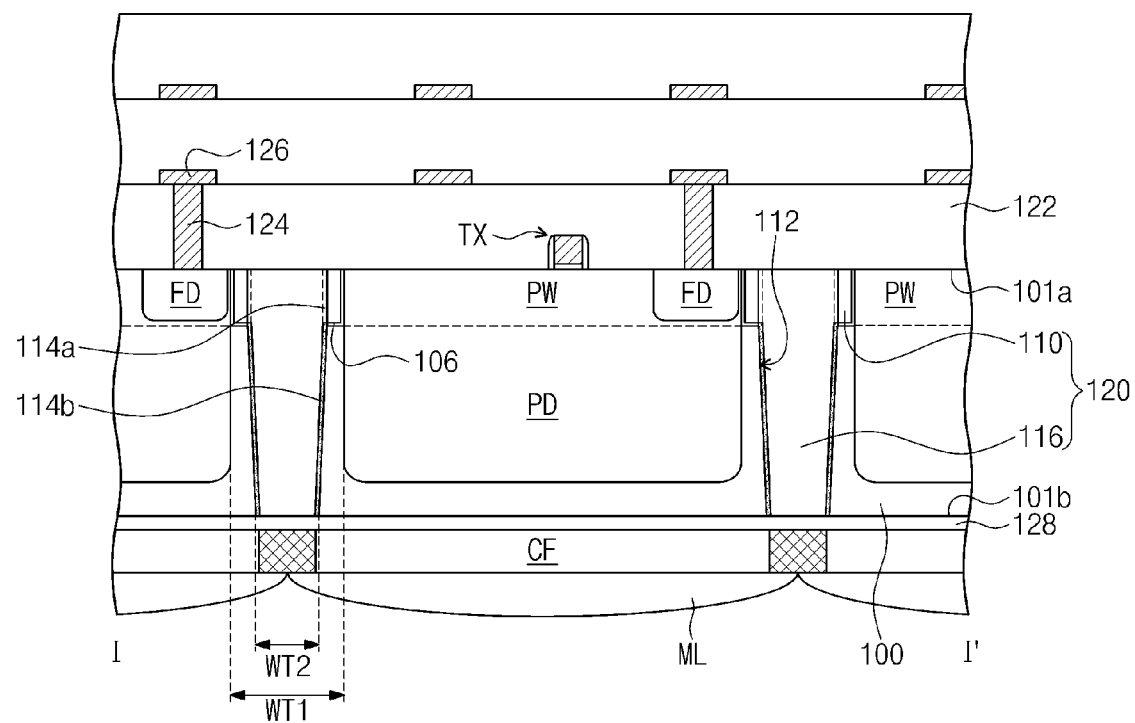

FIGS. 4A through 4N are sectional views illustrating a method of fabricating an image sensor according to example embodiments of the inventive concept.

Referring to FIG. 4A, a mask pattern 102 may be formed on the top surface 101a of the substrate 100. The mask pattern 102 may include, for example, an oxide layer (e.g., of silicon oxide). The substrate 100 may include, for example, a silicon layer doped with p-type impurities.

Referring to FIG. 4B, the substrate 100 may be etched using the mask pattern 102 as an etch mask to form a preliminary trench 104 having a first depth DT1.

Referring to FIG. 4C, a thermal oxidation process may be performed on the substrate 100 exposed by the preliminary trench 104 to form the thin thermal oxide layer 106. The thin thermal oxide layer 106 may be formed to conformally cover an inner surface of the preliminary trench 104. The thin thermal oxide layer 106 may be formed not to fill the preliminary trench 104.

In example embodiments, the formation of the thin thermal oxide layer 106 may be omitted.

Referring to FIG. 4D, a first insulating layer 108 may be conformally formed on the substrate 100 provided with the preliminary trench 104 and the mask pattern 102. The first insulating layer 108 may be formed not to fill the preliminary trench 104.

In example embodiments of the inventive concept, the first insulating layer 108 may include a MTO layer formed by a vapor deposition process. The MTO layer may be formed at a temperature ranging from about 600° C. to about 800° C. In example embodiments, the first insulating layer 108 may be formed of or include one of polyethylene oxide (PEOX), SiN, or SiON.

Referring to FIG. 4E, the first insulating layer 108 may be anisotropically etched to form the spacer 110 on inner side surfaces of the preliminary trench 104. In example embodiments, the spacer 110 may be formed to expose the thin thermal oxide layer 106.

Referring to FIG. 4F, the thin thermal oxide layer 106 and the substrate 100 may be etched using the spacer 110 and the mask pattern 102 as an etch mask to form the trench 112. The trench 112 may be formed to have a second depth DT2, when measured from the top surface 101a of the substrate 100. The second depth DT2 may be greater than the first depth DT1.

In example embodiments, the trench 112 may be formed by performing an anisotropic etching process. The trench 112 may be formed to have a tapered profile due to the anisotropic etching process. For example, a bottom width of the trench 112 may be smaller than a top width thereof.

In example embodiments, the spacer 110 may be used as a shallow trench isolation (STI) of the image sensor. Accordingly, an additional process for forming an STI structure may be omitted. Since the trench 112 is formed using the spacer 110 as an etch mask, the spacer 110 serving the STI may be self-aligned to the trench 112.

Referring to FIG. 4G, impurities may be injected into the substrate 100 provided with the trench 112, the spacer 110, and the mask pattern 102 to form an impurity region 114.

In example embodiments, the impurities may be p-type impurities (e.g., boron (B)). The injection of the impurities may be performed using a plasma doping (PLAD) process. Compared with a beam ion injection process, the PLAD process may allow impurities to be conformally injected into a surface of the substrate 100.

Hereinafter, for concise description, a portion of the impurity region 114 formed near the spacer 110 and the mask pattern 102 will be referred to as an upper impurity region 114a, and a portion of the impurity region 114 formed at a lower portion of the trench 112 will be referred to as a lower impurity region 114b.

Referring to FIG. 4H, the upper impurity region 114a may be removed using, for example, a wet etching process.

In example embodiments, the wet etching process may be performed to prevent the impurities from being completely removed from the upper impurity region 114a. For example, some of the impurities may remain in the upper impurity region 114a. In this case, the upper impurity region 114a may have an impurity concentration lower than that of the lower impurity region 114b.

Referring to FIG. 4I, the insulating gapfill layer 116 may be formed to fill the trench 112.

In detail, the insulating gapfill layer 116 may be formed on the mask pattern 102 to fill the trench 112. The insulating gapfill layer 116 may include at least one of materials having a good gap-filling property. For example, the insulating gapfill layer 116 may be formed of or include at least one of oxides (e.g., HDP oxide, PECVD oxide and/or USG, MTO) or nitrides (e.g., SiN). Thereafter, an upper portion of the insulating gapfill layer 116 may be polished to expose the top surface of the mask pattern 102. Accordingly, as shown in FIG. 4J, the device isolation structure 120 including the insulating gapfill layer 116 and the spacer 110 may be formed in the substrate 100.

In example embodiments, the insulating gapfill layer 116 may serve as the DTI and STI, and the spacer 110 may serve as the STI. As described above, since the spacer 110 is self-aligned to the trench 112, the insulating gapfill layer 116 filling the trench 112 may also be self-aligned to the spacer 110.

In the case where the DTI structure penetrating the STI structure is not formed using a self-aligned method, misalignment of the DTI structure may occur. In particular, in the case where the DTI structure is misaligned to have a portion positioned in the unit pixel PU, the unit pixels PU may suffer from deterioration in uniformity of electrical characteristics. However, in the afore-described embodiments, the formation of the insulating gapfill layer 116 may be performed in the self-aligned manner relative to the spacer 110, and this may make it possible to improve uniformity of electrical characteristics of the unit pixels PU and moreover increase a photodiode area per the unit pixel PU.

Referring to FIG. 4J, the mask pattern 102 may be removed. In example embodiments, an upper portion of the insulating gapfill layer 116 may be etched in the process of removing the mask pattern 102. Accordingly, the insulating gapfill layer 116 may have a top surface that is substantially coplanar with the top surface 101a of the substrate 100.

In some example embodiments, the top surface of the insulating gapfill layer 116 may be substantially coplanar with that of the spacer 110.

In some example embodiments, the top surface of the insulating gapfill layer 116 may be substantially coplanar with the top surface 101a of the substrate 100 and the top surface of the spacer 110.

Referring to FIG. 4K, the photoelectric conversion element PD, the well region PW, and the floating diffusion region FD may be formed in the substrate 100 provided with the device isolation structure 120.

For example, in the case where the substrate 100 is doped to have the p-type, the photoelectric conversion element PD or a photodiode may be formed by deeply injecting n-type impurities into the substrate 100. The well region PW may be formed by injecting p-type impurities into a top portion of the substrate 100 adjacent to the top surface 101a. The floating diffusion region FD may be formed by injecting n-type impurities into a portion (e.g., an edge region) of the well region PW.

Referring to FIG. 4L, a readout circuit (not shown) and the wires 126 may be formed on the top surface 101a of the substrate 100.

For example, the readout circuit may be integrated on the substrate 100. Although in FIG. 4L, the transfer gate TX on the substrate 100 is illustrated as an example of the readout circuit, the readout circuit may further include a reset gate, a drive gate, and a selection gate. The interlayered insulating layer 122 may be formed to cover the readout circuit, the contact plug 124 may be formed to be electrically connected to the readout circuit, and the wires 126 may be formed to be electrically connected to the contact plug 124.

Referring to FIG. 4M, a grinding process may be performed on the bottom surface 101b of the substrate 100 to expose the lower portion of the device isolation structure 120. In example embodiments, the lower portion of the device isolation structure 120 may be exposed, but in other example embodiments, the lower portion of the device isolation structure 120 is not exposed.

Referring to FIG. 4N, the anti-reflection layer 128, the color filter CF, and the micro lens ML may be formed on the bottom surface 101b of the substrate 100. As a result, the fabrication of the image sensor may be finished.

Figure 5:
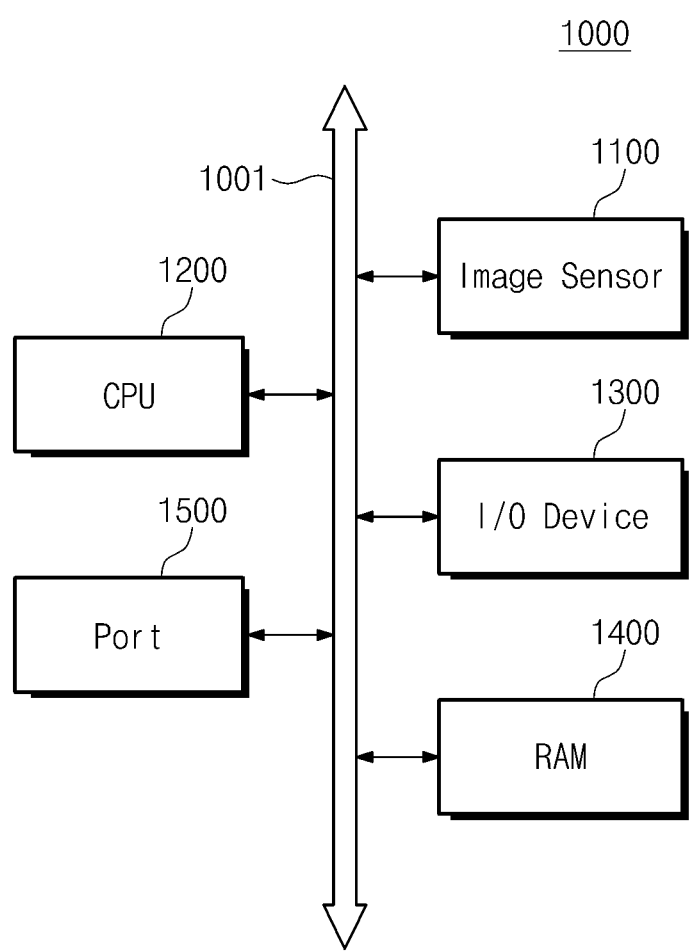
FIG. 5 is a schematic block diagram illustrating a processor-based system including an image sensor according to example embodiments of the inventive concept.

FIG. 5 is a schematic block diagram illustrating a processor-based system including the image sensor according to some embodiments of the inventive concept.

Referring to FIG. 5, the processor-based system 1000 is a system that processes output images of an image sensor 1100.

The system 1000 may include one of a computer system, a camera system, a scanner, a mechanical clock system, a navigation system, a video phone, a monitoring system, an automatic focus system, a tracking system, an operation monitoring system, and an image stabilizing system, but example embodiments of the inventive concepts may not be limited thereto.

The processor-based system 1000 such as a computer system may include a central processing unit (CPU) 1200 such as a microprocessor capable of communicating with an I/O device 1300 via a bus 1001. The image sensor 1100 may communicate with the CPU 1200 and/or the I/O device 1300 via the bus 1001 or another communication link. The processor-based system 1000 may further include a RAM 1400 and/or a port 1500 capable of communicating with the CPU 1200 through the bus 1001.

The port 1500 may be coupled with a video card, a sound card, a memory card, a USB device, or the like. Further, the port 1500 may be connected to an additional system to carry out data communication with the additional system. The image sensor 1100 may be integrated with a CPU, a digital signal processing device (DSP), or a microprocessor. Moreover, the image sensor 1100 may be integrated with a memory. Alternatively, the image sensor 1100 may be integrated in a chip different from that of a processor.

Figure 6:
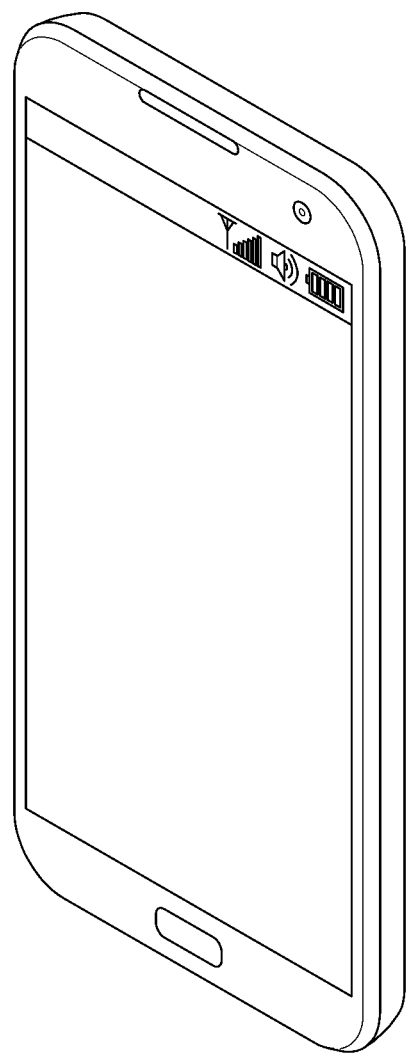
FIG. 6 is a perspective view illustrating an electronic product including an image sensor according to embodiments of the inventive concept.

FIG. 6 is a perspective view illustrating an electronic product including an image sensor according to embodiments of the inventive concept.

Referring to FIG. 6, the image sensor according to some embodiments of the inventive concept may be applicable to electronic devices such as mobile phones 2000. Further, the image sensor according to some embodiments may also be applicable to electronic devices such as cameras, camcorders, personal digital assistants (PDAs), wireless phones, laptop computers, optical mouse, facsimile machines or copying machines. In addition, the image sensor according to some embodiments may also be installed in telescopes, mobile phone handsets, scanners, endoscopes, fingerprint recognition systems, toys, game machines, household robots or automobiles.

According to exemplary embodiments of the inventive concept, each unit pixel may be defined by a device isolation structure including an insulating gapfill layer. Here, the device isolation structure may prevent light, which is incident into one of the unit pixels, from being incident into other unit pixel adjacent thereto. That is, the device isolation structure may serve as a DTI structure. Further, the device isolation structure may include a spacer electrically isolating the unit pixels from each other. For example, the device isolation structure may also serve as a STI structure. In addition, the insulating gapfill layer may be formed in a self-aligned manner by the spacer, and this makes it possible to improve uniformity of electrical characteristics of the unit pixels and increase a photodiode area per the unit pixel.

A lower impurity region may be formed to prevent impurities in a photoelectric conversion element from being diffused into the device isolation structure. Further, since the upper impurity region is formed to have a lower impurity concentration than that of the lower impurity region and the spacer is provided, it is possible to prevent impurities in the upper impurity region from being diffused into a readout circuit.

While example embodiments of the inventive concepts have been particularly shown and described, it will be understood by one of ordinary skill in the art that variations in form and detail may be made therein without departing from the spirit and scope of the attached claims.

What is claimed is:
1. An image sensor, comprising:
a substrate including a top surface and a bottom surface, and having a first conductivity type;
a device isolation structure defining a plurality of pixel regions in the substrate; and
a photoelectric conversion element formed in each of the pixel regions, and having a second conductivity type different from the first conductivity type,
wherein the device isolation structure comprises:
an insulating gapfill layer extending from an upper portion to a lower portion of the device isolation structure;
a spacer provided at the upper portion of the device isolation structure and interposed between the insulating gapfill layer and the substrate;
a lower impurity region provided at the lower portion of the device isolation structure and interposed between the insulating gapfill layer and the substrate, the lower impurity region having the first conductivity type; and an upper impurity region provided between the spacer and the insulating gapfill layer, the upper impurity region having the first conductivity type, wherein the lower impurity region has an impurity concentration higher than that of the upper impurity region.

2. The image sensor of claim 1, wherein the insulating gapfill layer is extended from the top surface of the substrate to the bottom surface of the substrate through the substrate.

3. The image sensor of claim 1, further comprising a thin thermal oxide layer between the spacer and the substrate.

4. The image sensor of claim 1, wherein the device isolation structure comprises a plurality of portions, each of which is shaped like a rectangular ring and encloses a corresponding of the pixel regions.

5. The image sensor of claim 1, wherein a total height of the insulating gapfill layer of the device isolation structure is greater than that of the photoelectric conversion element, and a total height of the spacer is smaller than that of the photoelectric conversion element.

6. The image sensor of claim 1, wherein the spacer of the device isolation structure comprises at least one of middle temperature oxide (MTO), polyethylene oxide (PEOX), silicon nitride (SiN), and silicon oxynitride (SiON), and the insulating gapfill layer of the device isolation structure comprises at least one of high density plasma (HDP) oxide, undoped silicate glass (USG), middle temperature oxide (MTO), plasma enhanced chemical vapor deposition (PECVD) oxide, and silicon nitride (SiN).

7. The image sensor of claim 1, wherein a top surface of the spacer is substantially coplanar with the top surface of the substrate and/or a top surface of the insulating gapfill layer.

8. The image sensor of claim 1, further comprising a readout circuit on the top surface of the substrate and electrically connected to the photoelectric conversion element.

9. The image sensor of claim 1, further comprising:
a color filter on the bottom surface of the substrate to face a corresponding one of the pixel regions; and
a micro lens on the color filter.

10. The image sensor of claim 1, wherein the insulating gapfill layer is self-aligned by the spacer.

11. An image sensor, comprising:
a substrate including a top surface and a bottom surface, the substrate having a first conductivity type;
a deep trench isolation (DTI) structure defining a plurality of pixel regions in the substrate;
a shallow trench isolation (STI) structure adjacent to the top surface of the substrate and on an upper side surface of the DTI structure to serve as a spacer;
a lower impurity region between a lower portion of the DTI structure and the substrate;
an upper impurity region between the DTI and STI structures; and
a photoelectric conversion element formed in each of the pixel regions,
wherein the lower impurity region has an impurity concentration higher than that of the upper impurity region.

12. The image sensor of claim 11, wherein the DTI structure is self-aligned by the STI structure.

13. The image sensor of claim 11, wherein the substrate has a first conductivity type,
the photoelectric conversion element has a second conductivity type different from the first conductivity type, and
the lower impurity region has the first conductivity type.

14. The image sensor of claim 11, wherein the upper impurity region has the first conductivity type.

15. The image sensor of claim 11, wherein the DTI structure is extended from the top surface of the substrate to the bottom surface of the substrate through the substrate.

16. The image sensor of claim 11, wherein a top surface of the STI structure is substantially coplanar with a top surface of the substrate and/or a top surface of the DTI structure.

* * * * *